United States Patent [19]

Kutzavitch

[11] 4,218,649
[45] Aug. 19, 1980

[54] HIGH VOLTAGE LEAKAGE AND BREAKDOWN TEST CIRCUIT

[75] Inventor: Walter G. Kutzavitch, Indianapolis, Ind.

[73] Assignee: Bell Telephone Laboratories, Incorporated, Murray Hill, N.J.

[21] Appl. No.: 899,393

[22] Filed: Apr. 24, 1978

[51] Int. Cl.² .................... G01R 31/12; G01R 31/02
[52] U.S. Cl. .................................... 324/54; 324/60 C
[58] Field of Search .............. 324/54, 60 R, 60 C, 324/60 CD

[56] References Cited

U.S. PATENT DOCUMENTS

| | | | |
|---|---|---|---|
| 1,482,462 | 2/1924 | Dubsky | 324/54 |
| 1,823,492 | 9/1931 | Houck | 324/54 |
| 2,087,783 | 7/1937 | Savage | 324/54 |
| 2,594,595 | 4/1952 | Stearns | 324/54 X |
| 2,894,204 | 7/1959 | Gambrill | 324/54 |
| 2,932,791 | 4/1960 | Carrington | 324/54 X |
| 3,017,571 | 1/1962 | Moricca et al. | 324/54 X |
| 3,135,915 | 6/1964 | Odok | 324/54 |
| 3,211,998 | 10/1965 | Kidwell | 324/54 |
| 3,823,370 | 7/1974 | Pendleton et al. | 324/54 |
| 3,919,635 | 11/1975 | Bowen et al. | 324/54 |

Primary Examiner—Gerard R. Strecker
Attorney, Agent, or Firm—Harry L. Newman; Hugh L. Logan

[57] ABSTRACT

A circuit is disclosed for testing electrical apparatus to detect leakage and voltage breakdown failure paths and, furthermore, to indicate if the impedances in the paths are below predetermined levels and thereby to characterize the type and nature of the failure. A feature of the circuit is the use of a high voltage test source which has sufficient internal impedance to prevent hazardous currents if a user should accidentally come into contact with the source output.

4 Claims, 3 Drawing Figures

HIGH VOLTAGE LEAKAGE AND BREAKDOWN TEST CIRCUIT

BACKGROUND OF THE INVENTION

1. Field of the Invention

This invention relates to testing for high voltage leakage and breakdown paths.

2. Description of the Prior Art

Electrical apparatus is sometimes subject to external high voltages because of power line crosses, lightning transients and the like. When this happens, leakage and/or breakdown paths within the apparatus may present a shock hazard to a user. It is therefore desirable, if not required, that such apparatus be tested prior to going into use so as to detect such paths and to derive an indication as to their impedances.

As external voltages of the above-mentioned type are applied by relatively low impedance sources, it would appear that similar sources would be required to test the apparatus. Low impedance test sources, however, expose testing personnel to shock hazards in the same sense as with any other external high voltage source. It is desirable therefore to use a test source which has a high internal impedance so that its current limiting characteristic reduces the risk of danger from electrical shock.

SUMMARY OF THE INVENTION

An object of the present invention is to use a high impedance voltage source to determine if a circuit is subject to leakage and/or voltage breakdown failures, furthermore, to determine if the circuit has an impedance less than a predetermined value in series with the leakage or breakdown path and thereby to characterize the type and nature of the failure.

This and other objects are achieved in accordance with the invention by a circuit configuration comprising a first parallel circuit formed with a high impedance, high voltage source and a first capacitor, and a second parallel circuit formed with a second capacitor and a resistor where the first and second parallel circuits are connected in series to a pair of output terminals.

When a leakage path appears across the output terminals, a portion of the source voltage appears across the second parallel circuit and is indicative of the impedance in the leakage path.

On the other hand, when a breakdown path is connected between the output terminals, current flows in the breakdown path over a relatively short period of time and is supplied basically by a charge on the first capacitor. As a result of breakdown current, a charge is quickly accumulated in the second capacitor with the amount of the charge dependent upon the impedance in the breakdown path. This charge is subsequently dissipated in the resistor. A breakdown path therefore causes relatively short duration voltage waves to appear across the second parallel circuit where the amplitude of these waves is indicative of the impedance in the breakdown path.

Leakage and breakdown voltages of a hazardous and non-hazardous nature appearing across the second parallel circuit are easily distinguishable from one another by the use of high and low pass filters.

Other objects and features of the invention will become apparent from a study of the following detailed description of an embodiment of the invention.

DETAILED DESCRIPTION

Figure 1:
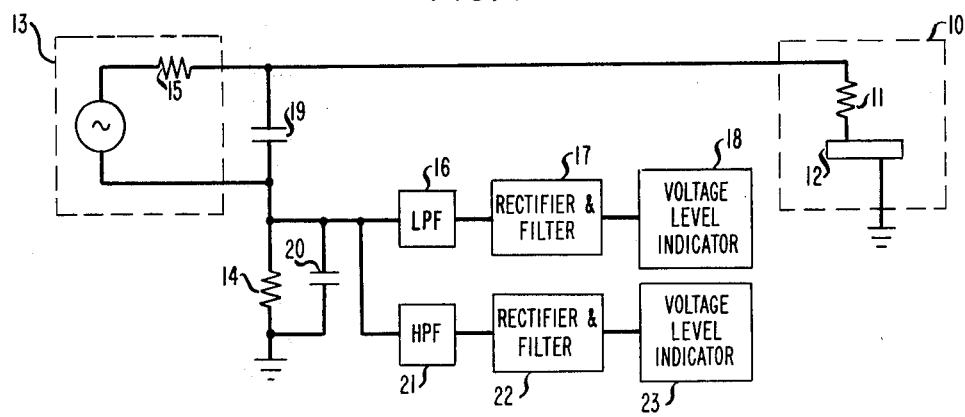
FIG. 1 shows an embodiment of the invention connected to apparatus under test where the apparatus has a leakage path.

FIG. 1 shows an embodiment of the invention connected to apparatus under test 10 which has a leakage path—shown as resistor 11—to some metallic part 12 of the apparatus. It would be such a metallic part that a user might touch and thereby provide a hazardous current path to ground. (In the test set-up, a wire connection to ground is provided.) It is believed apparent that the shock risk to the user is a function of the leakage path resistance and the voltage applied to that path and not a function of the resistance of the user's body.

The test equipment comprises a relatively high impedance source 13 having one output lead connected to apparatus 10 and the other output lead connected by way of a resistor 14 to ground. As mentioned in the previous paragraph, metallic part 12 of apparatus 10 is connected to ground by way of a wire connection. Source 13 may provide—in an open output circuit state—a 60 hertz, 1000 volt rms potential. Source 13 has a source impedance as represented by a resistor 15. Resistor 15 has a sufficient value to prevent a harmful current from passing through anyone coming into direct contact with the output leads of source 13.

In the structure thus far described, a 60 hertz voltage, whose amplitude is related to the leakage as represented by resistor 11, is developed across resistor 14. This voltage is passed by a low pass filter 16 to a rectifier and filter 17. The output level of rectifier and filter 17 is indicated by a voltage level indicator 18. This indication is a measure of the leakage of apparatus 10.

FIG. 1 also shows a capacitor 19 connected in parallel with source 13, a capacitor 20 connected in parallel with resistor 14, a high pass filter 21 for passing voltages across capacitor 20 which are in excess of 60 hertz, a rectifier and filter 22 for receiving the output from filter 21 and a voltage level indicator 23 responsive to the output of rectifier and filter 22. Capacitor 20 is large compared to capacitor 19. All of these elements cooperate with those already mentioned in the test equipment in the process of testing for and characterizing between hazardous and non-hazardous voltage breakdown paths. This is now discussed in detail with respect to FIGS. 2 and 3.

Figure 2:
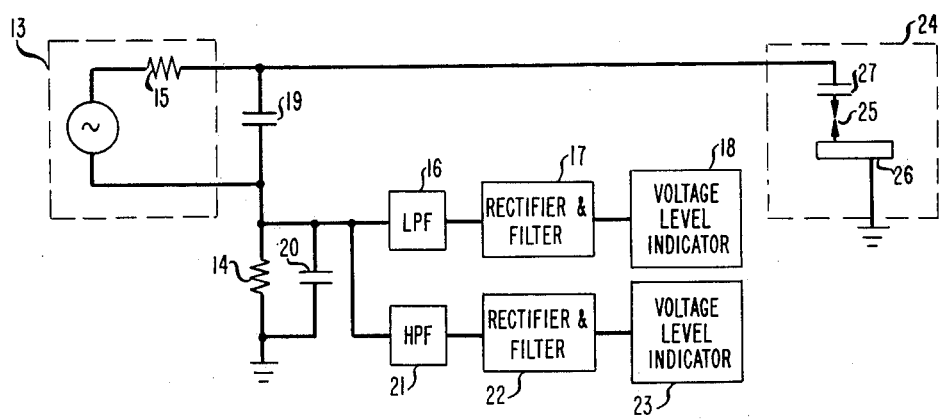
FIG. 2 shows the embodiment of FIG. 1 connected to apparatus under test where the apparatus has a high voltage breakdown path with series capacitance within the path.

In FIG. 2, the test equipment of FIG. 1 is connected to apparatus under test 24 which has a voltage breakdown path 25 through a capacitor 27 in series with path 25 to a metallic part 26 of the apparatus. This breakdown capacitor may take any form including distributed capacitance. As before, for testing purposes, metallic part 26 is connected to ground by way of a wire.

The test equipment—under the conditions shown in FIG. 2—operates in the following manner.

Capacitor 27 introduces an impedance in the breakdown path. Under a low impedance high voltage condition—as would occur with a power cross—this capacitance might be the only realistic current limiting element in the breakdown path which—it should be remembered—includes the user's body to ground. Therefore, when the capacitance is below some particular value, the apparatus may be considered to be safe, while on the other hand, when it is between that level and infinity, it may be judged unsafe. As will now be discussed in detail with respect to FIG. 2, the test circuit is able to identify capacitances above and below a predetermined level.

As mentioned earlier, capacitor 20 is greater in size (as, for example, twenty times) than capacitor 19. These capacitors are further chosen so that the value of capacitor 19 is greater than (as, for example, twenty times) the above-mentioned predetermined level for capacitor 27.

Assume the output voltage from source 13 in FIG. 2 is zero, no charges appear on capacitors 19, 20 and 27 and no current flows in breakdown path 25. As the output voltage for source 13 increases in either a positive or negative direction, a charge appears on capacitor 19. As the voltage across that capacitor increases, a level is reached whereby path 25 breaks down. When this breakdown occurs, the majority of the breakdown current comes from capacitor 19. This current begins to build up a charge on capacitors 20 and 27. Capacitor 27, however, rapidly charges (it is smaller than either of capacitors 19 and 20) and presents an impedance to current flow which causes the arc in breakdown path 25 to extinguish. From this explanation, it is believed apparent that the charge on capacitor 20 and therefore the voltage level across that capacitor is directly related to the value of capacitor 27.

All of the above-described action takes place within a small fraction of one-half of a cycle of the test voltage. Once the breakdown path current ceases, capacitor 19 is the sole component in the output path of source 13 while capacitor 20 begins to discharge via resistor 14.

Because of ionization conditions surrounding breakdown path 25, the path will not necessarily break down with each half cycle of the test voltage. It will break down often enough, however, for higher-than-60-hertz voltage components to be developed across capacitor 20. These components are passed by high pass filter 21 to rectifier and filter 22. The level of the output of rectifier and filter 22 is indicated by indicator 23 which may be a meter or light emitting diodes responsive to voltage levels.

Figure 3:
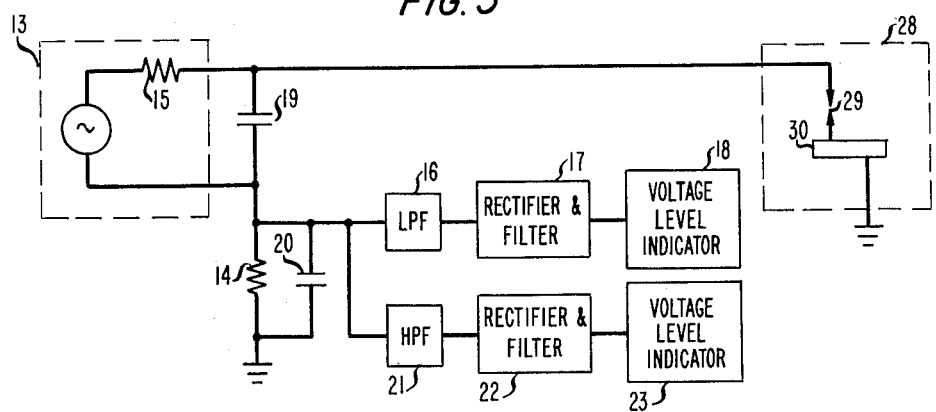
FIG. 3 shows the embodiment of FIG. 1 connected to apparatus under test where the apparatus has a high voltage breakdown path.

When capacitor 27 is not present (i.e., it has an infinite value), the breakdown path is hazardous and its equipment circuit appears as shown in FIG. 3. In particular, an unsafe apparatus under test 28 is connected to the test circuit. This apparatus has a breakdown path 29 to a metallic part 30. During testing, the voltage developed across capacitor 20 is the maximum for this condition.

It has been found desirable in some uses of the test equipment to insert a resistor between the parallel combination of the high voltage source 13 and capacitor 19 and the said apparatus under 10, 24, and 28. to limit the maximum current from capacitor 19 to prevent damage to apparatus under test. This resistor has not been shown in the drawings because it is not always necessary.

I claim:

1. A combination for testing a circuit to determine if leakage and/or insulation breakdown failures occur under a predetermined input voltage, and, furthermore, to determine if said leakage, when present, is in excess of a predetermined value and if said breakdown, when present, has capacitance in series therewith which exceeds a predetermined value, said combination comprising
   a first parallel circuit formed by a high voltage source of alternating current having an internal impedance to limit its current to non-hazardous levels and a first capacitor having a capacitance value greater than the predetermined value of capacitance in series with the breakdown,
   a second parallel circuit formed by a second capacitor having a capacitance value greater than the first capacitor and a resistor,
   a pair of output terminals, between which the circuit under test is connected,
   means connecting said parallel circuits in series between said terminals, and
   a detector circuit connected across said second parallel circuit to indicate when the voltage thereacross has a frequency equal to that of said source, identifying a leakage failure, and an amplitude in excess of a predetermined level, characterizing the leakage as hazardous, and, furthermore, to indicate when the voltage thereacross has a frequency in excess of that of said source, identifying a breakdown failure, and when the value of capacitance in series with the breakdown exceeds the predetermined value, characterizing the breakdown as hazardous.

2. A test circuit in accordance with claim 1 in which said first capacitor has a capacitance value substantially greater than the predetermined value of capacitance in series with said breakdown and said second capacitor has a value of capacitance substantially greater than that of said first capacitor.

3. A combination for testing a circuit to determine if leakage and/or insulation breakdown failures occur under a predetermined input voltage, and, furthermore, to determine if said leakage, when present, is in excess of a predetermined value and if said breakdown, when present, has capacitance in series therewith which exceeds a predetermined value, said combination comprising
   a first parallel circuit formed by a high voltage source of alternating current having an internal impedance to limit its current to non-hazardous levels and a first capacitor having a value more than twenty times greater than the predetermined value of capacitance in series with the breakdown,
   a second parallel circuit formed by a second capacitor having a value more than twenty times greater than that of the first capacitor and a resistor,
   a pair of output terminals, between which the circuit under test is connected,
   means connecting said parallel circuits in series between said terminals,
   a first detector circuit connected across said second parallel circuit to indicate when the voltage thereacross has a frequency equal to that of said source, identifying a leakage failure, and an amplitude in excess of a predetermined level, characterizing the leakage as hazardous, and
   a second detector circuit connected across said second parallel circuit and said first detector circuit to indicate when the voltage thereacross has a frequency in excess of that of said source, identifying a breakdown failure, and when the value of capacitance in series with the breakdown exceeds the predetermined value, characterizing the breakdown as hazardous, whereby, upon the occurrence of a breakdown failure, the capacitance in series with the breakdown rapidly charges, tending to extinguish the breakdown and causing a voltage level directly related to the series breakdown capacitance to appear across the second capacitor.

4. A combination for testing a circuit to determine if insulation breakdown failures occur under a predetermined input voltage and, furthermore, to determine if said breakdown, when present, has capacitance in series therewith which exceeds a predetermined value, characterizing the breakdown as hazardous, said combination comprising a high voltage source of alternating current having an internal impedance to limit its current to non-hazardous levels, a first capacitor connected in parallel with said source and having a value substantially greater than said predetermined value in series with said breakdown, a second capacitor connected in series with said parallel combination of said first capacitor and said high voltage source and having a value substantially greater than that of said first capacitor, a resistor connected in parallel with said second capacitor, a pair of output terminals connected to the extremities of the series combination of said first and second capacitors, between which the circuit under test is connected and a detector circuit connected across said second capacitor to indicate when the voltage thereacross has a frequency in excess of that of said source, identifying a breakdown failure, and when the value of capacitance in series with the breakdown exceeds the predetermined value, characterizing the breakdown as hazardous, whereby the detector circuit relies upon the relationship established among the predetermined value of capacitance in series with the breakdown, the first capacitor, and the second capacitor to identify and characterize a hazardous breakdown failure.

* * * * *